FLEXURAL MODE CERAMIC RESONATOR

Filed Sept. 12, 1967

INVENTORS
ISAO SAITO
KUNIICHI NAGATA
TAKEHIRO FUTAMI
BY
Hopgood & Calimafde
ATTORNEYS United States Patent Office 3,531,742
Patented Sept. 29, 1970

3,531,742

FLEXURAL MODE CERAMIC RESONATOR

Isao Saito, Kuniichi Nagata, and Takehiro Futami, Tokyo-to, Japan, assignors to Nippon Electric Company, Limited, Tokyo-to, Japan, a corporation of Japan Filed Sept. 12, 1967, Ser. No. 667,193
Claims priority, application Japan, Sept. 30, 1966, 41/64,553
Int. Cl. H03h 9/04, 9/20; H01v 7/00
U.S. Cl. 333—72 4 Claims

ABSTRACT OF THE DISCLOSURE

A resonator including a member of ceramic material having a pair of arrays of electrodes on opposed surfaces thereof, which utilizes a flexural mode vibration caused by the piezeoelectric longitudinal effect.

Background of the invention

As those knowledgeable in the art are aware, the relative bandwidth (i.e. the ratio of the bandwidth to the center frequency of the pass band) of a ceramic filter which does not have an inductive coil element, depends primarily on the capacitance ratio defined by the ratio of the parallel capacitance component to the series capacitance component of the resonator equivalent circuit. Thus, a small ceramic resonator having a small capacitance ratio is necessary for producing a low frequency broadband ceramic filter.

Conventional ceramic resonators for this purpose are exemplified by a rectangular resonator of bimorphic structure such as those shown in FIG. 1. As is well known, these conventional resonators utilize the piezoelectric transverse effect. The capacitance ratio is, therefore, necessarily relatively large and it has been difficult to provide a broadband ceramic filter.

Objects and features of the invention

One object of the present invention is to provide a ceramic resonator for use as a broadband low frequency ceramic filter.

A feature of this invention is that a ceramic resonator is provided which utilizes the piezoelectric longitudinal effect and exhibits a relatively low resonant frequency and a wide resonant frequency range.

All of the objects, features and advantages of this invention and the manner of attaining them will become more apparent and the invention itself will be best understood by reference to the following description of the invention taken in conjunction with the accompanying drawing.

Summary of the invention

Briefly, according to the invention there is provided a flexural mode resonator comprising a ceramic element having a pair of opposed arrays of thin film electrodes, partially surrounding the element body. Each array comprises a plurality of discrete element-embracing electrodes located at predetermined spatial intervals along the longitudinal axis of the element and extending in the direction perpendicular to said axis. When a driving electric signal is applied to these opposed arrays the element is caused to flexurally resonate within the major surface plane in accordance with the piezoelectric longitudinal effect and provides broadband characteristics due to a significantly reduced capacitance ratio.

DESCRIPTION OF THE PREFERRED EMBODIMENT

Figure 1:
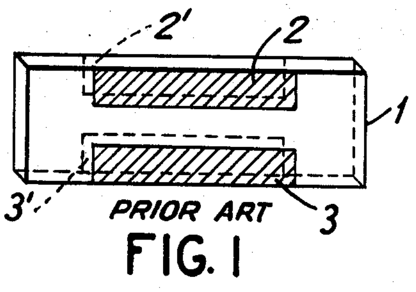
FIG. 1 is a perspective view of a conventional ceramic resonator.

Referring to FIG. 1, there is shown a ceramic resonator of the type described in the publication of "Journal of the Institute of the Electrical Communication Engineers of Japan," vol. 37, No. 11, page 38. As shown in the figure, two pairs of film electrodes 2, 2', 3 and 3' are longitudinally attached to the major surfaces of the resonator or vibrator 1. The length of each electrode is approximately equal to sixty percent of the length of the ceramic resonator 1. As will be apparent from the drawing, this resonator utilizes the piezoelectric transverse effect. The publication referred to above indicates that the capacitance ratio of the resonator can be reduced to a value of the order that can be obtained by utilizing the lengthwise transverse effect.

However, if the parameters of this resonator are applied to a lead-titanate-zirconate element, the capacitance ratio of the resonator cannot be made smaller than 13% and the relative bandwidth of the ceramic filter cannot be made greater than 10%.

Figure 2:
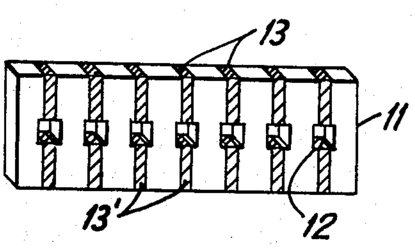
FIG. 2 is a view of an early type of ceramic resonator invented by the inventors of the present invention.

An attempt has been made to obtain a ceramic resonator of a smaller capacitance ratio by utilizing the piezoelectric longitudinal effect instead of the transverse effect. FIG. 2 illustrates an example which is proposed in our copending Japanese patent application No. 68374/1965.

In FIG. 2 there is shown a longitudinal effect-type rectangular resonator 11, wherein a plurality of apertures 12 are arranged along the longitudinal axis of the resonator at approximately equal intervals. At the apertures 12, film electrodes 13 and 13' are separately attached so that sections of equal longitudinal length may be formed along the axis. Because of the existence of the apertures 12, a sufficiently high polarizing voltage can be applied to the ceramic resonator to activate the same during the course of the polarization process. Also the stray capacitance can be reduced. Moreover, by taking advantage of the piezoelectric longitudinal effect, a ceramic resonator having a small capacitance ratio than that of the conventional transverse effect type resonator is obtained. This resonator of our earlier invention, however, has the disadvantage that the apertures 12 must be formed by an ultrasonic cutting machine, and also the disadvantages that the mechanical coupling is reduced and the capacitance ratio is increased by the apertures, because they are formed along the longitudinal axis. Such formation also significantly contributes to the mechanical coupling vibration. Therefore, with the resonator of the earlier type shown in FIG. 2, the capacitance ratio is not reduced to a satisfactory value.

The present invention further improves the characteristics of this earlier longitudinal effect type resonator.

Figure 3:
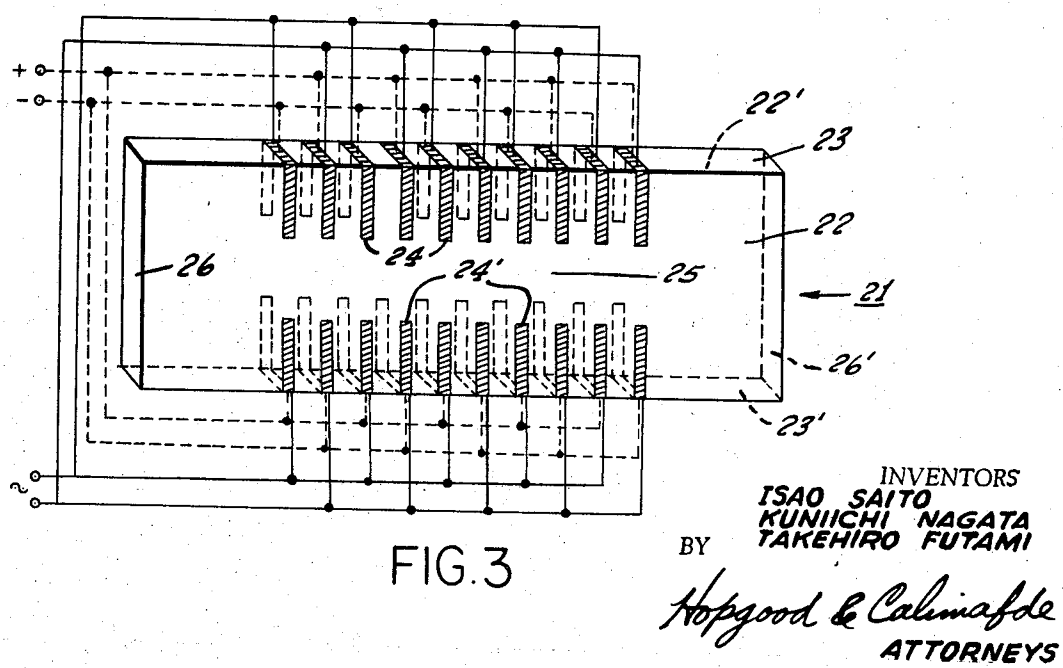
FIG. 3 is a view of a resonator and which embodies the features of the present invention.

Referring now to FIG. 3 which shows one embodiment of the present invention, the longitudinal effect-type rectangular resonator has a pair of major surfaces 22, 22', a pair of side surfaces 23, 23', and a pair of minor surfaces 26, 26', two arrays of U-shaped film electrodes 24 and 24' partially embrace the major surfaces 22, 22' and the side surfaces 23, 23' respectively as shown. The legs of each of the U-shaped film electrodes extend in a direction perpendicular to the longitudinal axis for a distance approximately equal to one third of the resonator width. The positions of the electrodes on the upper side of the major surface coincide with those on the lower side of the major surface of the resonator. Since the electrodes do not extend to the central area 25 of the major surfaces, and since the positions of the two arrays 24 and 24' of the electrodes coincide with each other in the longitudinal direction, a symmetry results with respect to the longitudinal axis. The resonator element is then subjected to polarization so that the areas defined by the electrodes in each array may be polarized alternately in the positive and negative directions along the longitudinal axis. The dotted-line connections shown in FIG. 3 indicate the polarization means, and solid line connections indicate means for driving alternating electric signal in operation. On the side of the array 24, when the direction of the polarization coincides with the polarity of the alternating electric field in the region defined by the electrodes, each of the sections is expanded in the longitudinal direction.

At the same time, since the polarization direction on the side of the array 24′ is opposite to the direction of the polarity of the driving electric field, each of the sections is contracted in the longitudinal direction. This local expansion and contraction responsive to the driving field, together with the mechanical coupling in the central portion 25, result in a flexural vibration in a direction perpendicular to the longitudinal axis of the resonator and within the plane of the major surface of the resonator.

It has been experimentally established to be appropriate to the improvement in the capacitance ratio of the resonator that the driving region of the present resonator, which comprises the sections defined by the arrays 24 and 24′ of the electrodes, should be identical to the similar region employed by the conventional transverse effect-type resonator. More particularly, the length of the square U-shaped electrodes measured in the direction perpendicular to the axis is, most favorably, approximately one third of the width of the ceramic element. Similarly, the axial length of the driving region is about 60% of the total length of the ceramic element. Also, the width and the intervals of the film electrodes are determined by taking the stray capacitance between the arrays into consideration. A series of experiments has shown that the preferred width of the electrodes ranges from approximately one half to the order of the thickness of the resonator, that the spatial interval of the electrodes should be greater than twice the thickness, and that the transverse spacing of the arrays of electrodes in each array should be greater than twice the spatial interval of the electrodes to avoid adverse effect on the improvement in the capacitance ratio. Therefore, the resonator should be as thin as possible in order to achieve the smallest capacitance ratio.

These experiments have also shown that the resonant frequency of the resonator is approximately proportional to the width thereof and inversely proportional to the second power of the length. The capacitance ratio of this resonator is significantly smaller than that obtained by the conventional transverse effect-type resonator because of the piezoelectric longitudinal effect. Also, since the mechanical coupling in the central portion of the resonator element is sufficient, the capacitance ratio of this resonator becomes significantly smaller than that obtainable by the proposed longitudinal effect type apertured resonator shown in FIG. 2.

As one example of this invention, the ceramic resonator of FIG. 3 has a capacitance ratio of 5.4 when made of lead-titanate-zirconate and is constructed as follows:

Length—28 mm.
Width—12 mm.
Thickness—0.5 mm.
Width of electrodes—0.5 mm.
Length of electrodes—4 mm. (i.e., ⅓ of resonator width)
Spatial interval between electrodes in each array—2 mm.

Driving region in central longitudinal position=60% of total resonator length.

By contrast, the capacitance ratio is 13 or more when the element is used as the transverse effect element of FIG. 1 and is 7 or more when used as the apertured element of FIG. 2. It will be apparent, therefore, that the present invention provides a resonator having a considerably improved capacitance ratio and broader band characteristics than the conventional elements.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. A flexural mode ceramic resonator comprising:
a ceramic resonator element of a rectangular parallelpiped shape with a large piezoelectric effect, said ceramic resonator element being provided with a pair of major surfaces, a pair of side surfaces, and a pair of minor surfaces,
a pair of opposed arrays of thin film electrodes,
each of said arrays including a plurality of discrete element-embracing electrodes located at predetermined spatial intervals along the longitudinal axis of said element, and partially surrounding one of said side surfaces and the adjacent ends of said major surfaces, and extending in the direction perpendicular to said axis, so that the lengths of extension are shorter than one half of the width of said major surface,
and means for supplying a driving electric signal to said arrays so that said driving electric signal of the same polarity as that of polarization is applied to one array and that of the opposite polarity to the other array, whereby said element exhibits the piezoelectric longitudinal effect and flexural vibration within the plane including said major surface.

2. The invention described in claim 1, wherein said electrodes are U-shaped and the legs of each set of the U-shaped electrodes extend along said major surfaces of said element for a distance approximately equal to one-third the width of said major surface.

3. The invention described in claim 1 wherein said electrodes have a width generally within the range from approximately one half to the order of the thickness of said element.

4. The invention described in claim 1 wherein said electrodes in each array are spaced at intervals generally greater than twice the thickness of said element.

References Cited

UNITED STATES PATENTS

| | | | |
|---|---|---|---|
| 1,796,650 | 3/1931 | Harrison | 179—100.41 |
| 1,977,169 | 10/1934 | Cady | 333—72 |
| 2,223,537 | 12/1940 | Sykes | 310—9.7 X |
| 2,497,680 | 2/1950 | Massa | 310—8.6 X |
| 2,540,187 | 2/1951 | Cherry | 310—9.8 X |
| 3,069,573 | 12/1962 | Liew | 310—9.7 X |
| 3,101,421 | 8/1963 | Kompanek | 310—9.8 X |

HERMAN KARL SAALBACH, Primary Examiner
W. N. PUNTER, Assistant Examiner

U.S. Cl. X.R.

310—9.8